(12) United States Patent
Koyanagi et al.

(10) Patent No.: US 6,411,238 B1
(45) Date of Patent: Jun. 25, 2002

(54) DIGITAL TO ANALOG CONVERTER WITH STEP VOLTAGE GENERATOR FOR SMOOTHING ANALOG OUTPUT

(75) Inventors: Yukio Koyanagi, jouetsu; Kazuo Toraichi, Sayama, both of (JP)

(73) Assignee: Niigata Seimitsu Co., Ltd., Jouetsu (JP)

( * ) Notice: Subject to any disclaimer, the term of this patent is extended or adjusted under 35 U.S.C. 154(b) by 0 days.

(21) Appl. No.: 09/743,456
(22) PCT Filed: Jun. 8, 1999
(86) PCT No.: PCT/JP99/03048
§ 371 (c)(1),
(2), (4) Date: Jan. 9, 2001
(87) PCT Pub. No.: WO00/04643
PCT Pub. Date: Jan. 27, 2000

(30) Foreign Application Priority Data

Jul. 16, 1998 (JP) .......................... 10-218532

(51) Int. Cl.⁷ .......................... H03M 1/06; H03M 1/66
(52) U.S. Cl. .......................... 341/144; 341/118
(58) Field of Search ................ 341/120, 144, 341/150, 118; 324/642; 318/561; 702/110; 330/129

(56) References Cited

U.S. PATENT DOCUMENTS

| | | | | |
|---|---|---|---|---|
| 3,617,880 A | * | 11/1971 | Cormack et al. | ............ 324/642 |
| 3,745,561 A | * | 7/1973 | Van Dijk et al. | ............ 341/120 |
| 3,781,626 A | * | 12/1973 | Kubo et al. | ................. 318/561 |
| 4,430,641 A | * | 2/1984 | Baur et al. | .................. 341/118 |
| 4,647,907 A | * | 3/1987 | Storey | ......................... 341/118 |

FOREIGN PATENT DOCUMENTS

| | | |
|---|---|---|
| JP | 63-217816 | 9/1988 |
| JP | 1-117426 | 5/1989 |
| JP | 3-60223 | 3/1991 |
| JP | 3-217126 | 9/1991 |

OTHER PUBLICATIONS

"Analog Signal Porcessing Technology", supervised by Hiroyuki Mizuno, Nikkei BP, Jun. 1991, p. 39.

* cited by examiner

Primary Examiner—Patrick Wamsley
(74) Attorney, Agent, or Firm—Dellett and Walters

(57) ABSTRACT

A digital-to-analog converter for generating output waveforms with less distortion without the need for high-speed components. The digital-to-analog converter comprises four data holding sections, four step function generators, an adding section, a D/A converter, two integrators and a timing controller. Four digital data successively inputs are held in the data holding sections, respectively, and the step function generators generate step function whose values corresponding to the held data. The adding section sums the step functions generated in the step function generators, and the D/A converter generates the analog stepwise voltage corresponding to the summed value. The two integrators integrate this combined waveform two times, thus producing a continuous analog voltage that connects the input digital data smoothly.

10 Claims, 11 Drawing Sheets

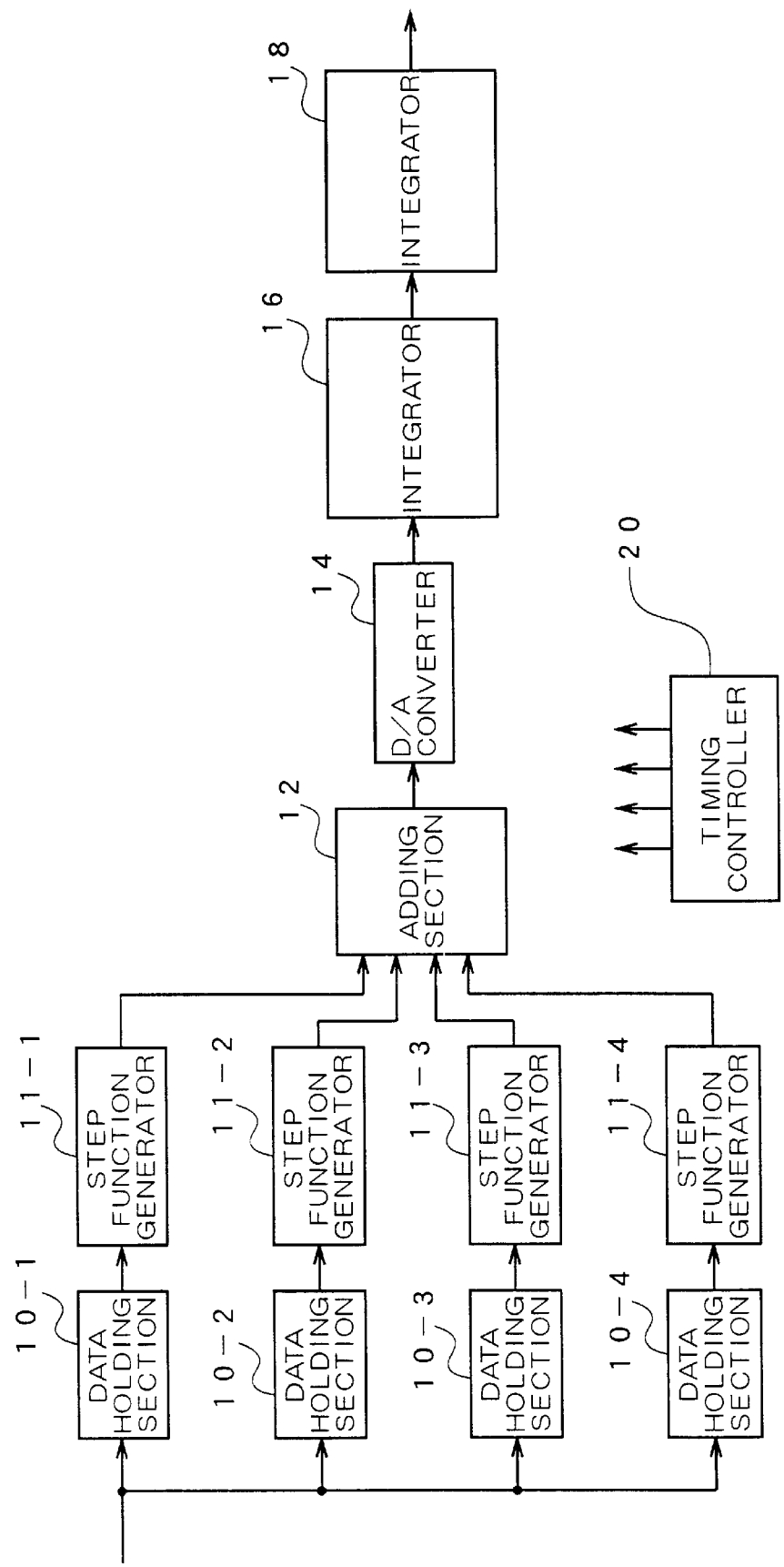

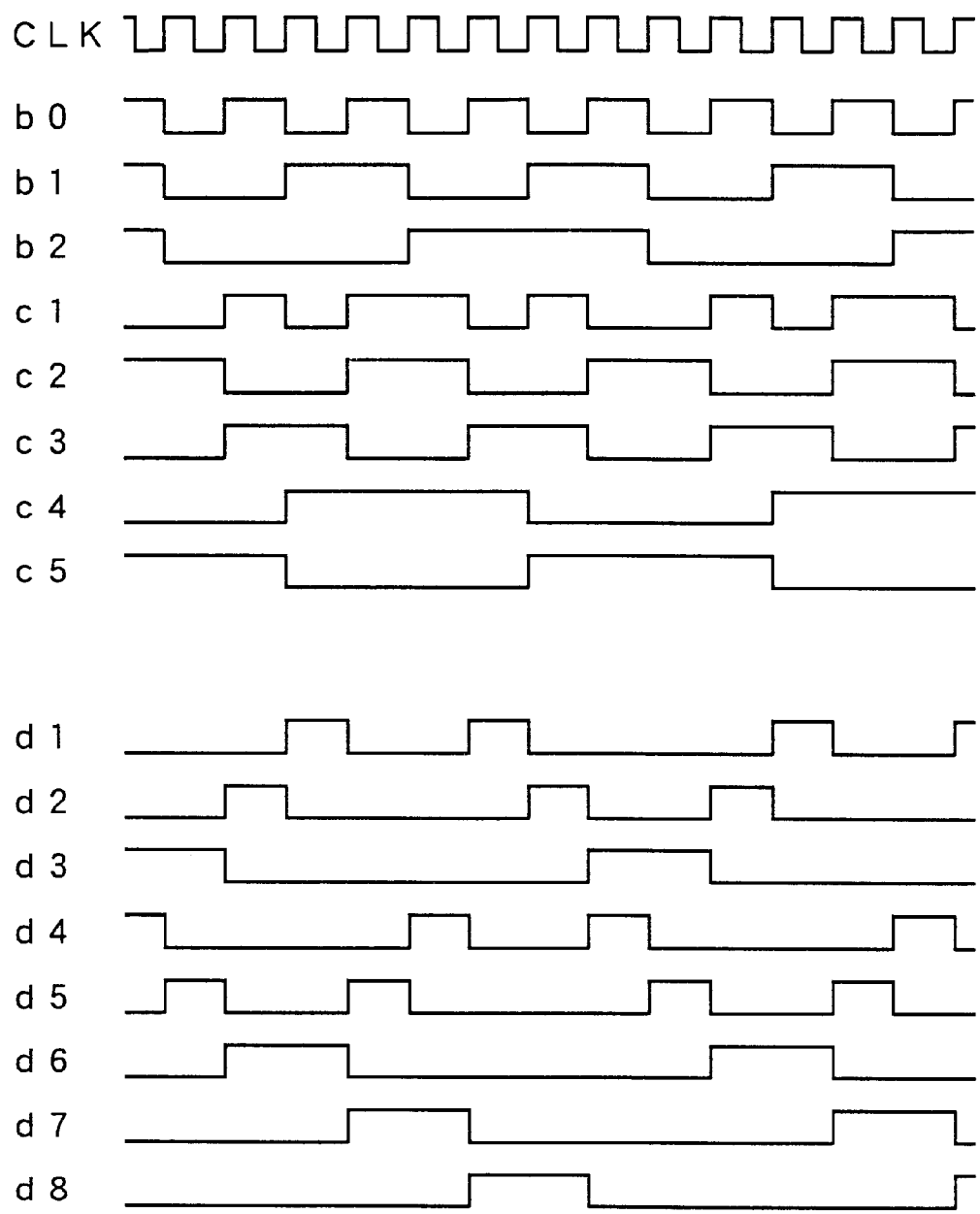
F I G. 12

DIGITAL TO ANALOG CONVERTER WITH STEP VOLTAGE GENERATOR FOR SMOOTHING ANALOG OUTPUT

BACKGROUND OF THE INVENTION

1. Field of the Invention

The present invention relates to a digital-to-analog converter for converting discrete digital data into continuous analog signals. In this specification, it is assumed that a case where function values have finite values except zero in a local region and become zero in regions different from the region is called a "local support."

2. Description of the Prior Art

A recent digital audio apparatus, for example, a CD (Compact Disk) player, uses a D/A (digital-to-analog) converter to which an over-sampling technique is applied to obtain a continuous analog audio signal from discrete music data (digital data). Such a D/A converter generally uses a digital filter to raise a pseudo sampling frequency by interpolating input digital data, and outputs smooth analog voice signals by passing each interpolation value through a low-pass filter after generating a staircase signal waveform with each interpolation value held by the sample holding circuit.

A data interpolating process is performed with a digital filter contained in a D/A converter using a sampling function generally referred to as a sinc function. FIG. 13 is an explanatory graph of a sinc function. This sinc function is obtained when a Dirac delta function is inverse-Fourier-transformed, and is defined as $\sin(\pi ft)/(\pi ft)$ where the sampling frequency is f. This sinc function becomes one only at a sample point, where t=0, and zero at all other sample points.

Conventionally, an oversampling process is performed using a digital filter in which a waveform data of the sinc function is set to a tap counter of an FIR (finite impulse response) filter.

In the oversampling technology for performing an interpolating operation on discrete voice data using a digital filter, a low-pass filter having a moderate attenuation characteristic can be applied. Therefore, the phase characteristic with a low-pass filter can approach a linear phase characteristic, and the sampling aliasing noise can be reduced. Such an effect becomes more outstanding with a higher pseudo sampling frequency. However, when a sampling frequency rises, the processing speed of the digital filter and the sample holding circuit is also increased. Therefore, expensive parts applied in the high-speed process are required, thereby raising the entire parts cost. In addition, when a high sampling frequency (for example, several MHz) is necessary for image data, etc., a digital filter for oversampling and a sample holding circuit have to be mounted using parts operated around several ten MHz to several hundred MHz, which cannot be easily realized.

In addition, even when the oversampling technology is used, a smooth analog signal is generated by passing a staircase signal waveform through a low-pass filter. Therefore, when a low-pass filter is used, a linear phase characteristic in the strict sense cannot be expected. Furthermore, the above mentioned sinc function is a function converging to 0 at ±∞. Therefore, when a correct interpolation value is computed, all digital data values should be considered. However, for convenience of a circuit size, etc., the number of tap counters of a digital filter is set so as to the range of digital data to be taken into account is limited. Therefore, an obtained interpolation value contains a truncation error.

Thus, the conventional D/A converter using the oversampling technology requires parts for a high-speed operation to raise a pseudo sampling frequency, thereby incurring a high cost or realizing a necessary system with difficulty. Furthermore, the deterioration of the phase characteristic arises from using a low-pass filter, and a truncation error is contained because the digital filter to which a sinc function is applied is used. Therefore, distortion of output waveform according to the deterioration of the phase characteristic and the truncation error occurs.

BRIEF SUMMARY OF THE INVENTION

The present invention has been developed based on the above mentioned problems, the object of the present invention is to provide a digital-to-analog converter capable of obtaining an output waveform with less distortion without increasing the speed of operating parts.

A digital-to-analog converter of the invention generates a predetermined step functions having a value corresponding to respective input digital data and adds the step functions into a step wise analog voltage, and makes the analog integral operations multiple times to produce a continuous analog signal that connects smoothly the voltages corresponding to the digital data input successively. In this way, a step function corresponding to each of a plurality of digital data input successively is generated, and the values of the step functions are added. Thereafter, the result of addition is converted into an analog voltage and integrated to get a continuous analog signal. Therefore, there is no need of using a low-pass filter to get a final analog signal. Therefore, there is no deterioration of the group delay characteristic caused by variable phase characteristic depending on the frequency of a signal to be processed, resulting in an output waveform with less distortion. Also, since there is no need of speeding up the operation rate of parts, and using expensive parts, unlike the conventional method that performed the oversampling, it is possible to reduce the part costs.

In particular, the above-described step function is preferably obtained by differentiating a sampling function consisting of a piecewise polynomial multiple times. On the contrary, the waveform corresponding to the predetermined sampling function can be obtained by integrating this step function multiple times. Therefore, the convolution operation using the sampling function can be equivalently performed generating the step function, so that the processing contents can be simplified, and the volume of processing required for converting digital data to analog signal can be reduced.

The above-described sampling function is preferably differentiable only once over the whole range, and has values of a local support. It is considered that it is necessary that various signals existing in the natural world have differentiability because the signals change smoothly. Nevertheless, it is considered that it is not necessary that the differentiability is not always infinite, and that it is possible to sufficiently approximate natural phenomena so long as the signals can be differentiated only once. In this manner, although there are many advantages by using a sampling function of the local support that can be differentiated finite times, conventionally, it was considered that a sampling function fulfilling these conditions did not exist. Nevertheless, by the present inventor's research, a function fulfilling the conditions described above is found.

More specifically, the above-described sampling function is a function of local support having the values other than zero in a range where the sample point t is from −2 to +2. This sampling function is defined such that:

$(-t^2-4t-4)/4$ for $-2 \leq t < -3/2$, $(3t^2+8t+5)/4$ for $-3/2 \leq t < -1$, $(5t^2+12t+7)/4$ for $-1 \leq t < 1/2$, $(-7t^2+4)/4$ for $-1/2 \leq t < 1/2$, $(5t^2-12t+7)/4$ for $1/2 \leq t < 1$, $(3t^2-8t+5)/4$ for $1 \leq t < 3/2$, and $(-t^2+4t-4)/4$ for $3/2 \leq t \leq 2$ Or a step function waveform corresponding to such a sampling function may consist of eight piecewise sections in equal width with a weight of −1, +3, +5, −7, −7, +5, +3, and −1 in a predetermined range corresponding to five digital data arranged at an equal interval. This weighting process is preferably implemented by adding digital data itself to the result of multiplication of −2, +2, +4, −8, −8, +4, +2, −2 with a bit shift. Since the multiplication operation is performed by the bit shift, the simplified and fast processing can be effected.

In this way, the use of a sampling function differentiable only once over the whole range, the number of integrating operation after adding a plurality of a step function can be decreased, and the amount of calculation can be reduced. Also, because of the use of a sampling function having values of a local support, it is possible to handle only digital data corresponding to a section for the local support, so that the amount of calculation can be further reduced. Moreover, it is possible to prevent the truncation error from arising when the process is performed for the finite number of digital data.

BRIEF DESCRIPTION OF THE DRAWINGS

FIG. 6 is a block diagram showing the configuration of a D/A converter of an embodiment;

FIG. 12 is a chart showing the operation timings of the timing controller shown in FIG. 12.

DETAILED DESCRIPTION OF THE PREFERRED EMBODIMENT

Figure 1:
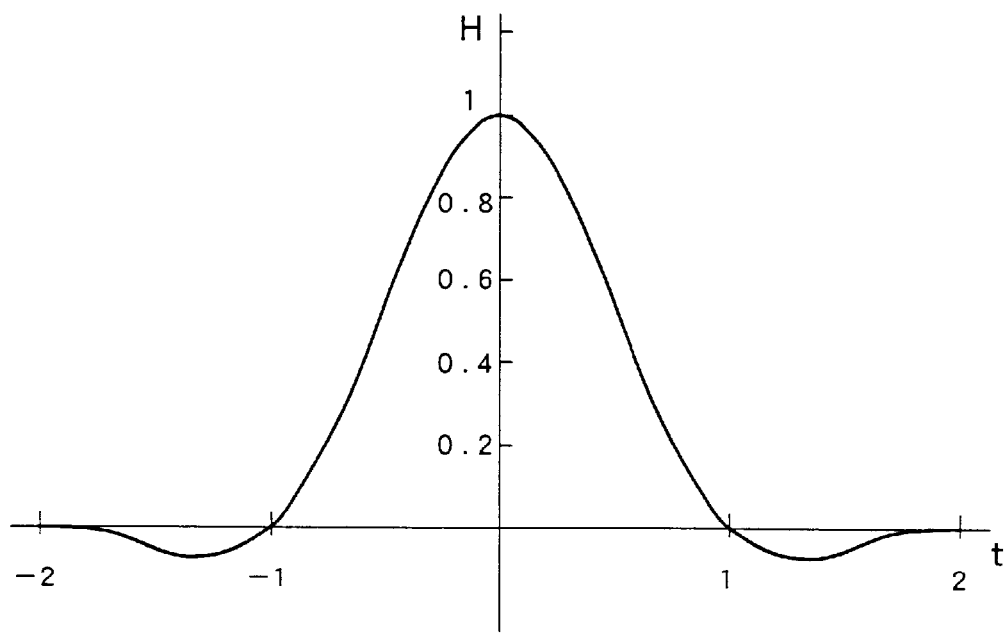
FIG. 1 is an explanatory graph of a sampling function used for an interpolating operation of a D/A converter according to an embodiment.

The D/A converter according to an embodiment of the present invention will be described below with reference to the drawings. FIG. 1 is an explanatory graph of a sampling function used for an interpolating operation of a D/A converter according to an embodiment. A sampling function H(t) shown in FIG. 1 is a function of a local support to which attention is paid on differentiability. For example, the function H(t) can be differentiated only once in the whole region and a function of a local support having finite values, which are not zeroes, when a sample position along a horizontal axis is between −2 and +2. In addition, since being a sampling function, the function H(t) is characterized in that the function H(t) becomes one only at a sample point with t=0 and becomes zero at sample points with t=±1 and ±2.

It is verified by the present inventor's investigation that a function H(t) fulfilling various conditions described above (a sampling function, one-time differentiability, and a local support) exists. Concretely, with letting a third order B spline function be F(t), such a sampling function H(t) can be defined as:

$$H(t)=-F(t+1/2)/4+F(t)-F(t-1/2)/4 \quad (1)$$

where F(t) is a third order B spline function.

Here, the third order B spline function F(t) is expressed as:

$$\begin{array}{ll}(4t^2+12t+9)/4; & -3/2 \leq t < -1/2 \\ -2t^2+3/2; & -1/2 \leq t < 1/2 \\ (4t^2-12t+9)/4; & 1/2 \leq t < 3/2\end{array} \quad (2)$$

The above-described sampling function H(t) is a quadric piecewise polynomial, and uses the third order B spline function F(t). Therefore, the function H(t) is a function of a local support that is guaranteed to be differentiable only once over the whole region. In addition, the function H(t) becomes zero at t=±1 and ±2.

Substituting the expression (2) into (1), the sampling function H(t) is represented in the form of a piecewise polynomial such that:

$$\begin{array}{ll}(-t^2-4t-4)/4; & -2 \leq t < -3/2 \\ (3t^2+8t+5)/4; & -3/2 \leq t < -1 \\ (5t^2+12t+7)/4; & -1 \leq t < -1/2 \\ (-7t^2+4)/4; & -1/2 \leq t < 1/2 \\ (5t^2-12t+7)/4; & 1/2 \leq t < 1 \\ (3t^2-8t+5)/4; & 1 \leq t < 3/2 \\ (-t^2+4t-4)/4; & 3/2 \leq t \leq 2\end{array} \quad (3)$$

In this manner, the above-described function H(t) is a sampling function and a function of a local support that can be differentiated only once over the whole region and converges to zero at sample point t=±2. Therefore, it is possible to perform interpolation of a value between sample values using a function, which is differentiable only once, by performing convolution on the basis of respective sample value using this sampling function H(t).

Figure 2:
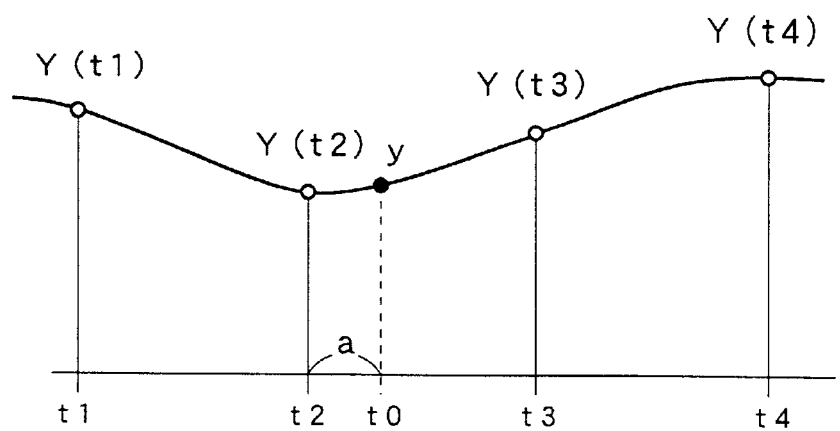
FIG. 2 is a graph showing a relation of the sampled values with an interpolated value between them.

FIG. 2 shows the relationship between sample value and interpolation values between the sample values. Generally, to obtain an interpolation value y corresponding to intermediate position between each sample value, the value of a sampling function is obtained for each piece of the given sample value at the position of the interpolation value, and a convolution operation is performed using the obtained value.

In order to obtain the interpolation value y accurately, since the sinc function conventionally used converges to zero at sample points t=±∞, it is necessary to calculate a value of the sinc function at a position of the interpolation according to each sample value between t=±∞ and performing convolution operation using these values. Nevertheless, since the sampling function H(t) used in this embodiment converges to zero at sample points with t=±∞2, it is sufficient to consider each two sample values before and after an interpolation point. Therefore, it is possible to drastically reduce operation quantity. In addition, since it is theoretically unnecessary to consider sample value except that without disregarding the sample value in consideration of operation quantity, accuracy, and the like although the sample value should be considered, no truncation error arises.

FIGS. 3A to 3D are graphs for explaining the data interpolation using the sampling function shown in FIG. 1. Hereinafter, for examples, the sample value Y(t1) at the sample position t1 shown in FIG. 3A will be described concretely. The distance from an interpolation point to t0 a sampling position t1 becomes equal to 1+a, when the distance between two adjacent sampling positions is normalized at 1. Accordingly, when the central position of the sampling function H(t) is aligned to the sampling position t1, the value of the sampling function at interpolation point to becomes equal to H(1+a). Practically, since the peak height of the center position of the sampling function H(t) is adjusted so that the peak height may coincide with the sample value Y(t1), a value to be obtained becomes a value H(1+a)·Y(t1) obtained by multiplying the above-described function value H(1+a) by Y(t1).

Figure 3A:
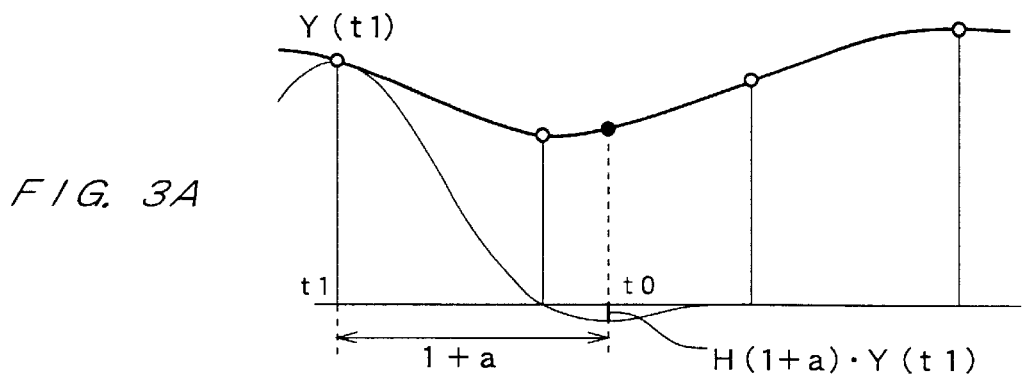
FIGS. 3A to 3D are graphs for explaining the data interpolation using the sampling function shown in FIG. 1.
Figure 3B:
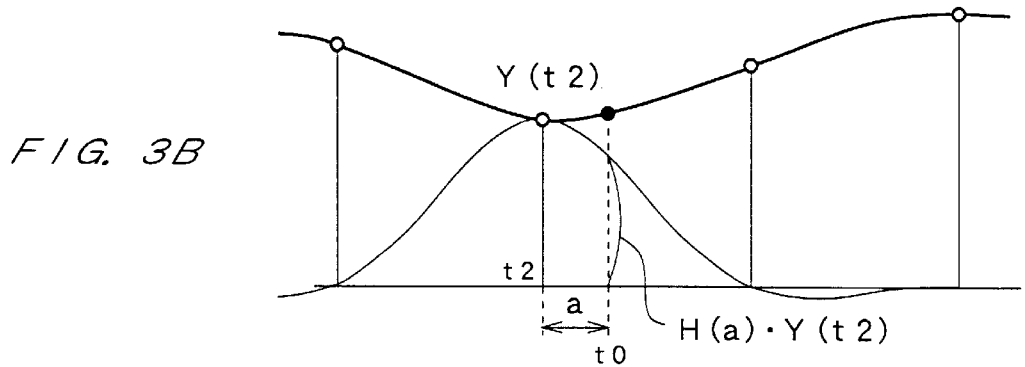
Figure 3C:
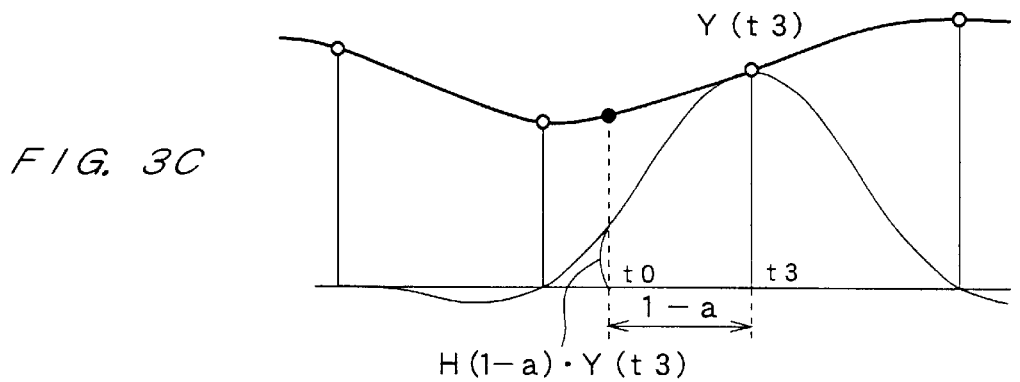
Figure 3D:
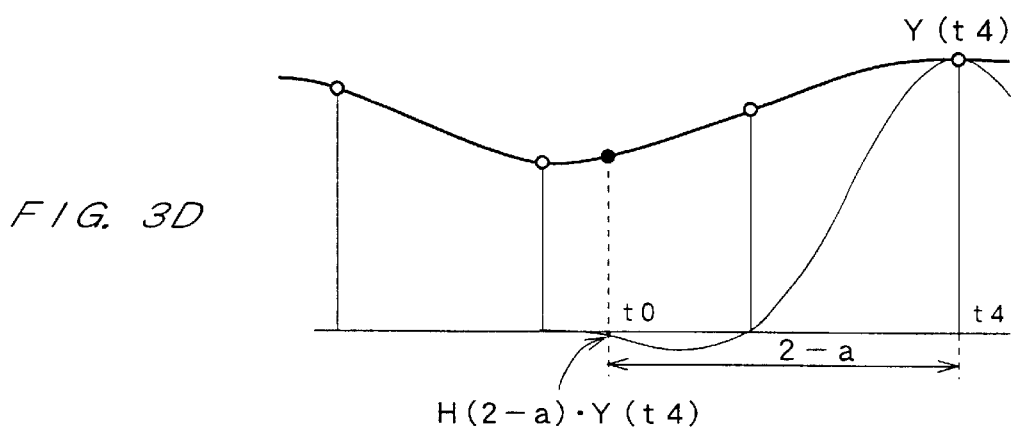

In the same way, the calculated results H(a)·Y(t2), H(1−a)·Y(t3), and H(2−a)·Y(t4) corresponding to other three sample values are obtained at interpolation position t0, as shown in FIGS. 3B to 3D. Then, four calculated results H(1+a)·Y(t1), H(a)·Y(t2), H(1−a)·Y(t3), and H(2−a)·Y(t4) are added, and convoluted to get an interpolated value y at interpolation point t0.

In principle, the value of the sampling function H(t) is calculated in correspondence to each sample value, and convoluted, so that an interpolated value corresponding to an intermediate position between the sample values can be obtained, as described above. However, the sampling function of FIG. 1 is a quadratic piecewise polynomial that is differentiable once over the whole region. Using this feature, the interpolated value can be obtained in accordance with other equivalent processing procedures.

Figure 4:
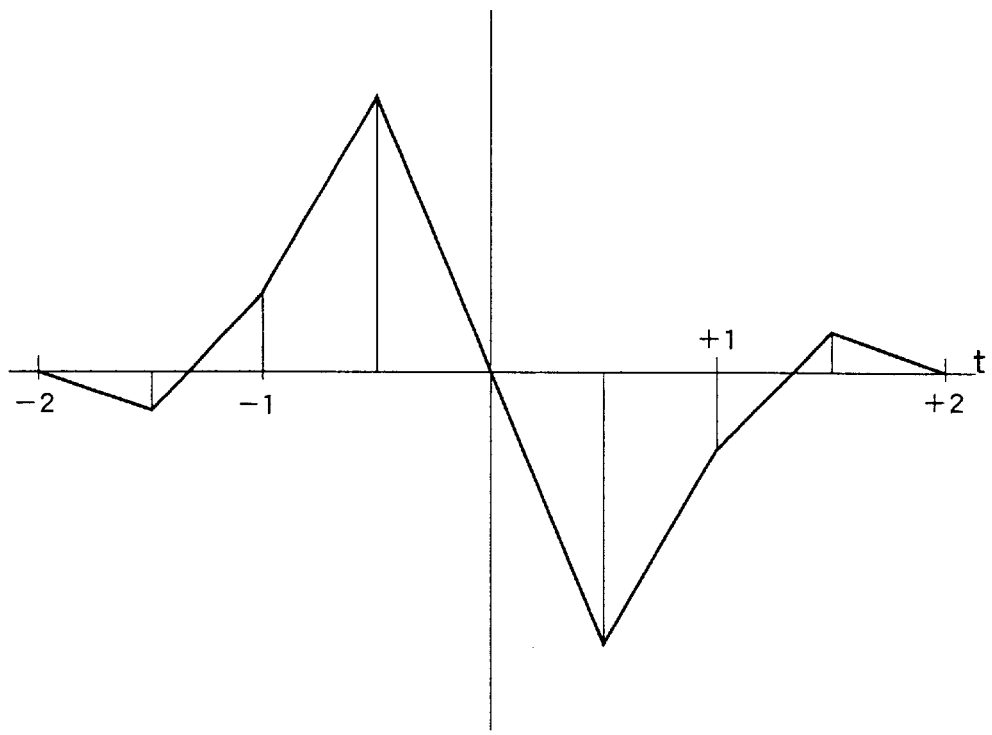
FIG. 4 is a graph showing a waveform in which the sampling function shown in FIG. 1 is differentiated once.

FIG. 4 is a graph representing a waveform where the sampling function of FIG. 1 is differentiated once. Since the sampling function H(t) of FIG. 1 is a quadratic piecewise polynomial that is differentiable only once over the whole region, a polygonal function consisting of continuous polygonal waveforms as shown in FIG. 4 can be obtained by differentiating the sampling function H(t) once.

Figure 5:
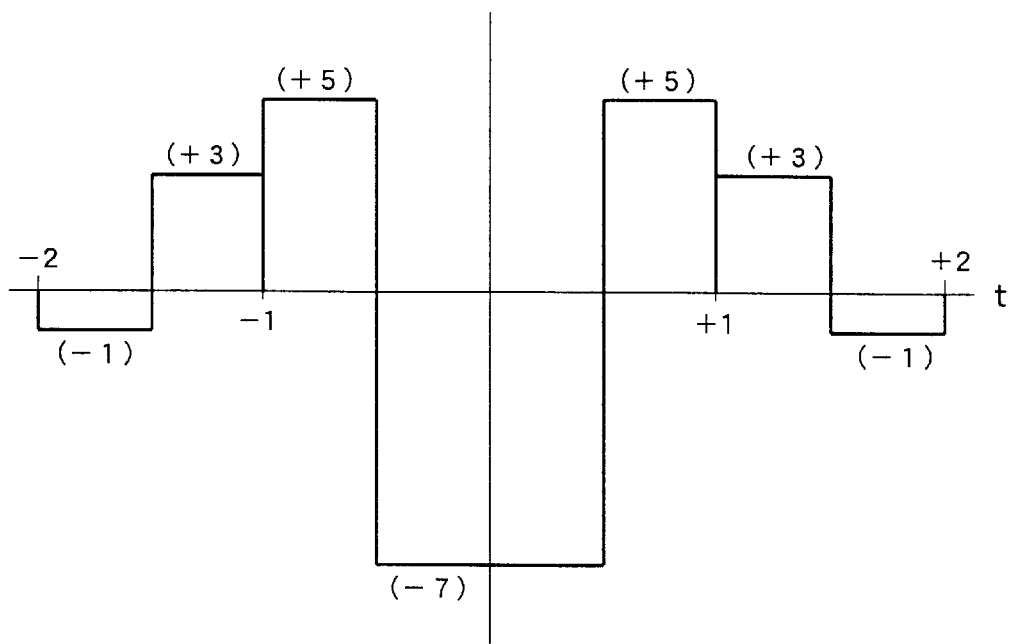
FIG. 5 is a graph showing a waveform in which a polygonal function shown in FIG. 4 is further differentiated.

FIG. 5 is a graph representing a waveform where the polygonal function of FIG. 4 is further differentiated. However, the polygonal waveform, containing a plurality of corner points, cannot be differentiated over the entire region, and is differentiated for a linear section between two adjacent corner points. By differentiating the polygonal waveform shown in FIG. 4, a step function consisting of staircase waveforms can be obtained, as shown in FIG. 5.

In this way, the sampling function for use with the interpolation operation in the D/A converter of this embodiment is differentiated once over the whole region to get a polygonal function. Further, this polygonal function is differentiated over each linear section to get a step function. Accordingly, in reverse order, the step function of FIG. 5 is generated and integrated twice, so that a sampling function H(t) of FIG. 1 can be obtained.

The step function as shown in FIG. 5 has a feature of having an equal area in the positive region and the negative region, in which the sum of area is zero. In other words, if the step function having such feature is integrated by multiple times, a sampling function of a local support that is assured to be differentiable over the entire region can be obtained, as shown in FIG. 1.

By the way, in calculating the interpolated value by the use of convolution operation shown in FIGS. 3A to 3D, the value of the sampling function H(t) is multiplied by each sample value. However, in the case where the step function as shown in FIG. 5 is integrated twice to get a sampling function H(t), the value of the sampling function obtained by this integration is multiplied by each sample value, but equivalently, in generating a step function before the integral operations, the step function may be multiplied by each sampled value, and then convoluted, and the thus-obtained result integrated twice to get an interpolated value. The D/A converter of this embodiment calculates the interpolated value in this way, and will be detailed below.

FIG. 6 is a diagram showing a configuration of the D/A converter of this embodiment. The D/A converter shown in FIG. 6 comprises four data holding sections 10-1, 10-2, 10-3, 10-4, four step function generators 11-1, 11-2, 11-3, 11-4, an adding section 12, a D/A converter 14, two integrators 16, 18, and a timing controller 20.

Each of the data holding sections 10-1 to 10-4 selects and accepts cyclically the discrete digital data input successively at a predetermined time interval, and holds its value till the next accept timing has arrived. For example, the digital data input at first is held in a data holding section 10-1; the digital data input secondly is held in a data holding section 10-2; the digital data input thirdly is held in a data holding section 10-3; and the digital data input fourthly is held in a data holding section 10-4. If the holding operation of data in each of the data holding sections 10-1 to 10-4 is circulated, the fifth discrete data input subsequently is accepted and held in the data holding section 10-1 that has held the data earliest. In this way, the digital data input successively is held cyclically in the data holding sections 10-1 to 10-4.

Each of the step function generators 11-1 to 11-4 generates a step function having an amplitude (crest value) proportional to the value of held data in synchronization with the holding timing of digital data in the corresponding one of the data holding sections 10-1 to 10-4. The step function itself has a shape as shown in FIG. 5, and the value of this step function is in proportion to the value of digital data held in each of the data holding sections 10-1 to 10-4. Specific values of the step function shown in FIG. 5 can be acquired by differentiating each piecewise polynomial of the above expression (3) twice and represented as follows.

$$\begin{aligned} -1; & \quad -2 \leq t < -3/2 \\ 3; & \quad -3/2 \leq t < -1 \\ 5; & \quad -1 \leq t < -1/2 \\ -7; & \quad -1/2 \leq t < 0 \\ -7; & \quad 0 \leq t < 1/2 \\ 5; & \quad 1/2 \leq t < 1 \end{aligned}$$

$$3; \quad 1 \leq t < 3/2$$

$$-1; \quad 3/2 \leq t \leq 2$$

The adding section 12 adds up digitally the values of the step functions output from four step function generators 11-1 to 11-4. The D/A converter 14 generates an analog voltage corresponding to stepwise digital data input from the adding section 12. Since this D/A converter 14 generates a constant analog voltage proportional to the input value of digital data, an output voltage with the voltage level changing stepwise corresponding to the input digital data is obtained.

Two integrators 16, 18 connected in tandem perform two integral operations for the stepwise changing output voltage appearing at an output end of the D/A converter 14. A linearly changing (like a linear function) output voltage is obtained from a former integrator 16, and an output voltage changing like a quadratic function is obtained from a latter integrator 18. In this way, if plural digital data are input at a fixed interval, the latter integrator 18 outputs a continuous analog signal with a smooth curve differentiable only once connecting the voltages corresponding to the digital data.

By the way, since the value of a step function output from a step function generator 11-1 is proportional to the value of digital data held in a data holding section 10-1, the voltage value corresponding to the value of this step function is integrated twice by two integrators 16, 18, so that the latter integrator 18 outputs a signal of voltage waveform corresponding to the result of multiplying the step function shown in FIG. 1 and the input digital data. Also, the adding section 12 adds up the values of the step functions output from the step function generators 11-1 to 11-4. This can be equivalently performed by the convolution process using a step function as shown in FIG. 1, paying attention to an output signal from the latter integrator 18.

Accordingly, considering the case where the digital data is input at a constant time interval into the D/A converter of this embodiment, the start timing of generating the step function waveform in each of the step function generators 11-1 to 11-4 is shifted corresponding to this input time interval. Then, the step functions generated in the step function generators 11-1 to 11-4 are added, and a resulting waveform is converted into an analog voltage, and integrated twice, to get an analog signal connecting smoothly the voltages corresponding to the digital data input at a fixed interval.

Figure 7A:
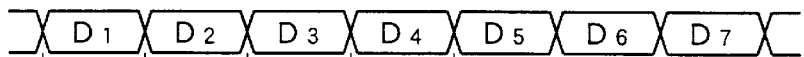
FIGS. 7A to 7L are charts showing the operation timings of the D/A converter of an embodiment.
Figure 7B:
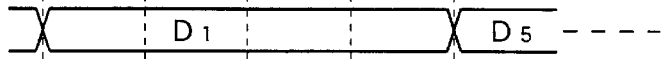
Figure 7C:
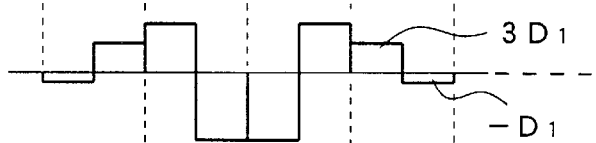

FIGS. 7A to 7L are charts showing the operation timings of the D/A converter in this embodiment. As shown in FIG. 7A, if the digital data $D_1, D_2, D_3, \ldots$ are input at a constant time interval, each of the data holding sections 10-1 to 10-4 accepts and holds these digital data $D_1, D_2, D_3, \ldots$ cyclically. More specifically, the data holding section 10-1 accepts a digital data $D_1$ input at first, and holds digital data $D_1$ till the input digital data is circulated (or till a fifth digital data $D_5$ is input) (FIG. 7B). The step function generator 11-1 generates a step function having a value proportional to this digital data $D_1$ in accordance with the hold timing of the first digital data $D_1$ (FIG. 7C).

Figure 7D:
Figure 7E:
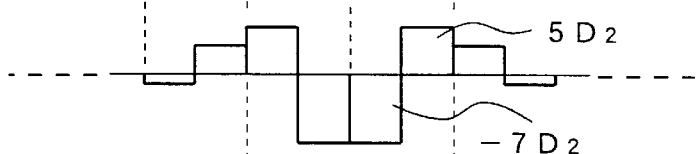

Similarly, the data holding section 10-2 accepts a digital data $D_2$ input secondly and holds the digital data $D_2$ till the input digital data is circulated (or a sixth digital data $D_6$ is input) (FIG. 7D). The step function generator 11-2 generates a step function having a value proportional to this digital data $D_2$ in accordance with the hold timing of the second digital data $D_2$ (FIG. 7E).

Figure 7F:
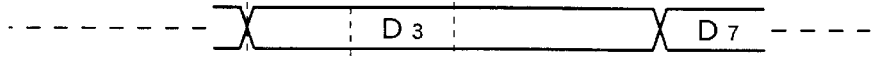
Figure 7G:

The data holding section 10-3 accepts a digital data $D_3$ input thirdly and holds the digital data $D_3$ till the input digital data is circulated (or a seventh digital data $D_7$ is input) (FIG. 7F). The step function generator 11-3 generates a step function having a value proportional to this digital data $D_3$ in accordance with the hold timing of the third digital data $D_3$ (FIG. 7G).

Figure 7H:
Figure 7I:
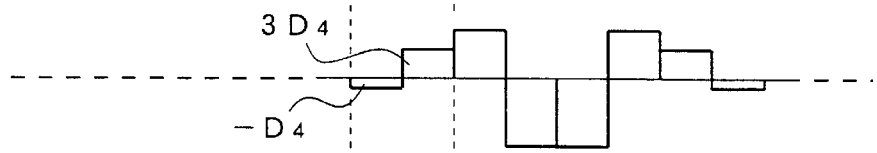

The data holding section 10-4 accepts a digital data $D_4$ input fourthly and holds the digital data $D_4$ till the input digital data $D_4$ is circulated (or an eighth digital data $D_8$ is input) (FIG. 7H). The step function generator 11-4 generates a step function having a value proportional to this digital data $D_4$ in accordance with the hold timing of the fourth digital data $D_4$ (FIG. 7I).

The adding section 12 adds values of step function output from each of four step function generators 11-1 to 11-4 in this way. By the way, the step function generated by each of the step function generators 11-1 to 11-4 as shown in FIG. 5 is a function of a local support having eight piecewise sections divided at every 0.5 from a region of the sample point $t=-2$ to $+2$ in which the sampling function of FIG. 1 has finite values. For example, a first piecewise section, a second piecewise section, . . . , and an eighth piecewise section are defined in a direction from the sample point $t=-2$ to $+2$.

More specifically, the adding section 12 at first adds a value $(3D_1)$ corresponding to the seventh piecewise section that is generated by the step function generator 11-1, a value $(-7D_2)$ corresponding to the fifth piecewise section that is generated by the step function generator 11-2, a value $(5D_3)$ corresponding to the third piecewise section that is generated by the step function generator 11-3, and a value $(-D_4)$ corresponding to the first piecewise section that is generated by the step function generator 11-4 to output a result of addition $(3D_1, -7D_2+5D_3-D_4)$.

Then, the adding section 12 adds a value $(-D_1)$ corresponding to the eighth piecewise section that is generated by the step function generator 11-1, a value $(5D_2)$ corresponding to the sixth piecewise section that is generated by the step function generator 11-2, a value $(-7D_3)$ corresponding to the fourth piecewise section that is generated by the step function generator 11-3, and a value $(3D_4)$ corresponding to the second piecewise section that is generated by the step function generator 11-4 to output a result of addition $(-D_1+5D_2-7D_3+3D_4)$.

Figure 7J:
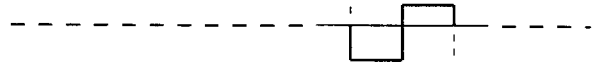

In this way, if the stepwise result of addition is output successively from the adding section 12, the D/A converter 14 generates the analog voltage based on the result of addition (digital data). Since the D/A converter 14 generates a constant analog voltage in proportion to the input value of digital data, it is possible to get an output waveform having a voltage level changing stepwise corresponding to the input digital data (FIG. 7J).

Figure 7K:
Figure 7L:

If the stepwise voltage level waveform is output from the D/A converter 14, the former integrator 16 integrates the waveform to output a polygonal waveform (FIG. 7K). The latter integrator 18 further integrates the polygonal waveform to produce an output voltage with a smooth curve differentiable only once connecting the voltage values corresponding to the digital data $D_2$ and $D_3$ (FIG. 7L).

In this way, the D/A converter of this embodiment generates a step function in accordance with the holding timing of input digital data, adds up the step functions for four digital data to produce an analog voltage corresponding to this result of addition, and integrates the resulting analog voltage twice to get a continuous analog signal smoothly connecting the voltage values corresponding to the digital data.

In particular, four step functions are generated corresponding to each input digital data at different start timings, the analog voltage corresponding to the result of addition is generated, and integrated twice to get a continuous analog signal. Hence, there is no need of preparing a sample hold circuit and a low pass filter that were conventionally required. There is no degradation in the linear phase characteristic, whereby the excellent group delay characteristic can be achieved. Since a sampling function H(t) of a local support which converges to zero at a sample point t=±2 is used, an interpolation process between digital data only uses four digital data, so that the amount of processing required for the interpolation can be diminished. Further, since the oversampling process as conventionally performed is not conducted, it is only necessary to assure a predetermined operation speed that is determined depending on the time interval of input digital data, and there is no need of effecting particularly fast signal processing and using expensive parts.

Figure 8:
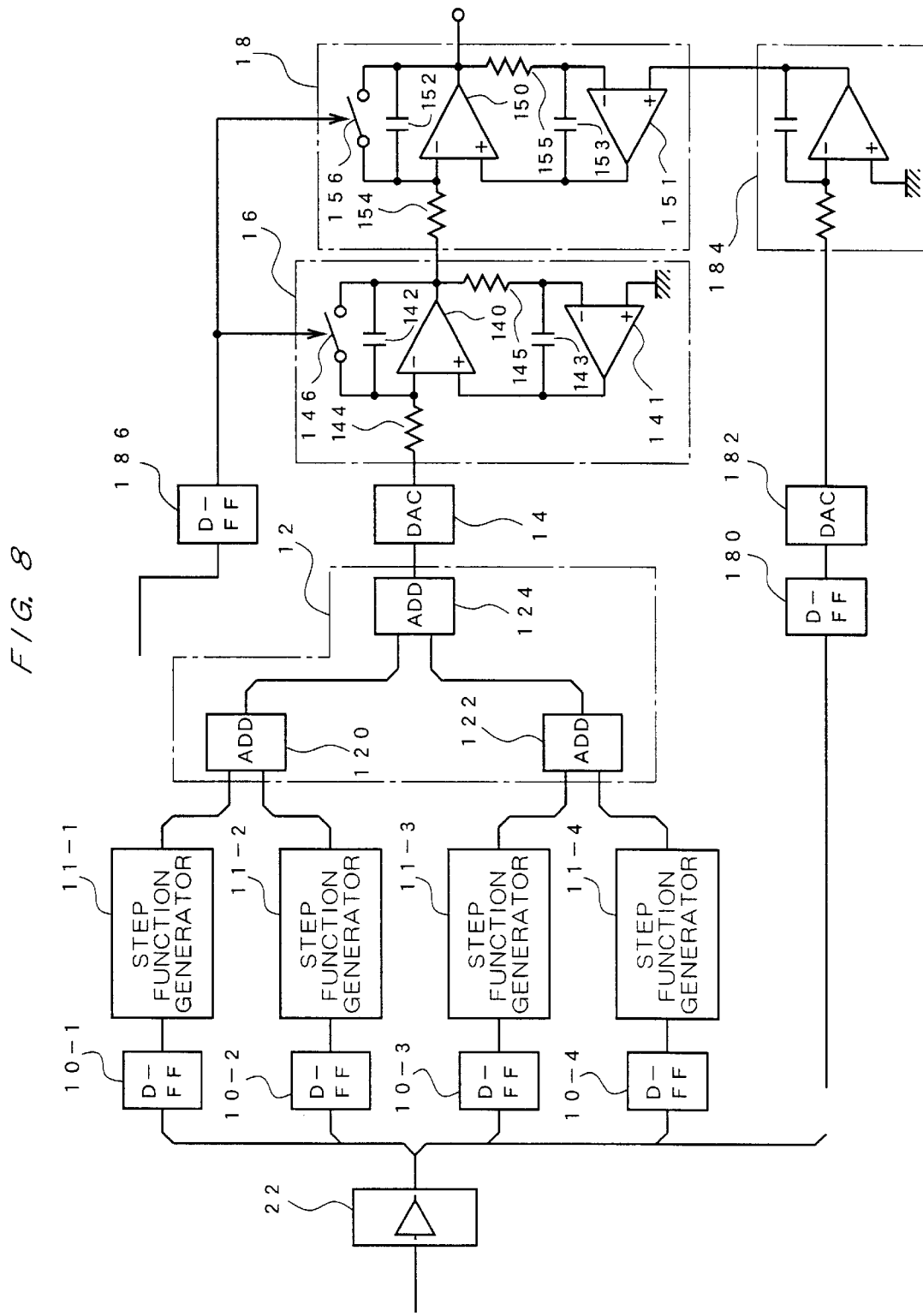
FIG. 8 is a diagram showing a detailed configuration of the D/A converter shown in FIG. 6.

FIG. 8 is a diagram showing a detailed configuration of a D/A converter shown in FIG. 6. As shown in FIG. 8, each of the data holding sections 10-1 to 10-4 is configured by a D-type flip-flop (D-FF), and holds the input data $D_1$, $D_2$, $D_3$, . . . cyclically by shifting the timing of accepting the data input via a buffer 22 one period of the input data. For example, if the digital data of eight bits is input, the 8-bit data held in each of the data holding sections 10-1 to 10-4 is input to the corresponding one of the step function generators 11-1 to 11-4.

Figure 9:
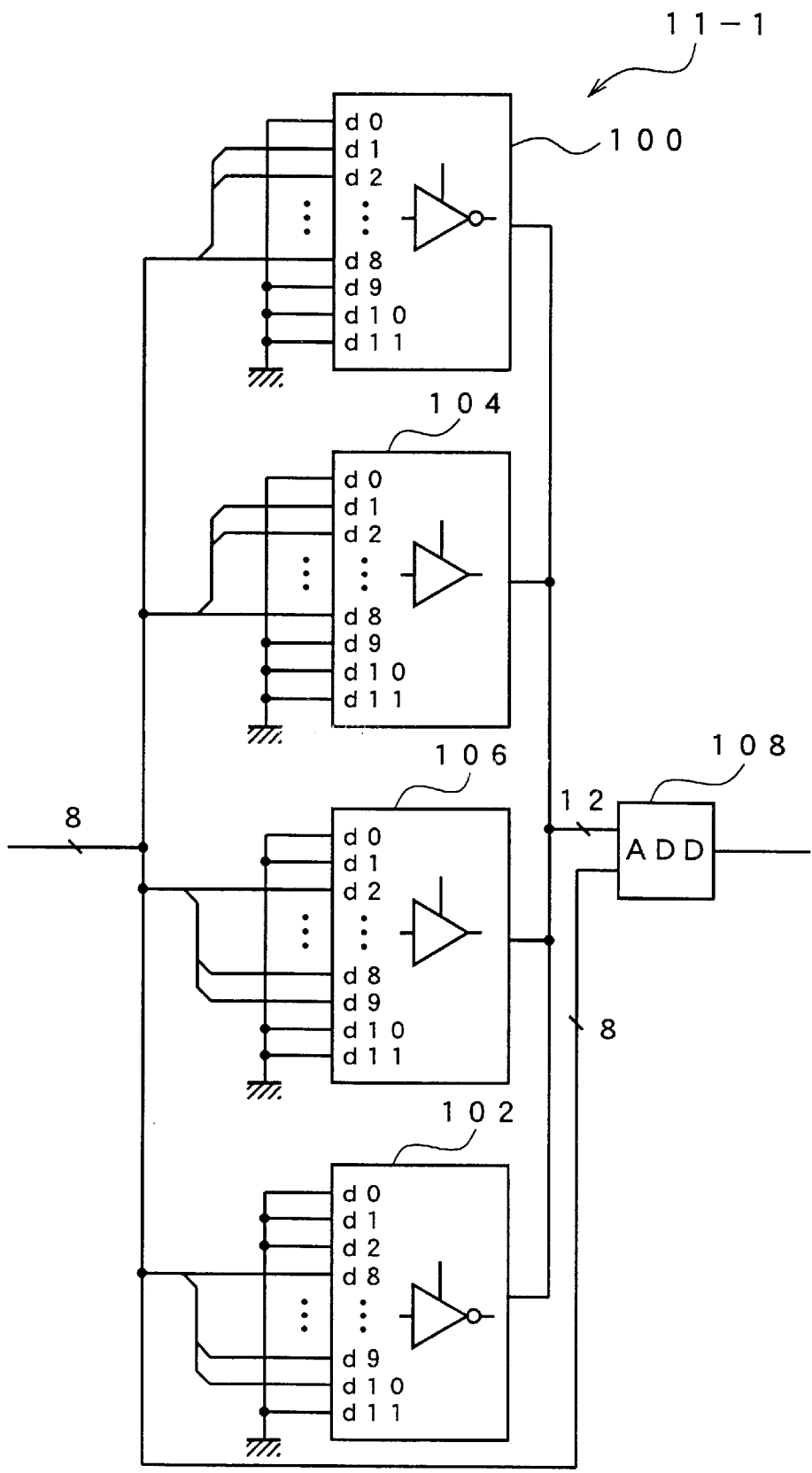
FIG. 9 is a diagram showing a detailed configuration of the step function generator.

FIG. 9 is a diagram showing a detailed configuration of each of the step function generators 11-1 to 11-4. Four step function generators 11-1 to 11-4 have the same configuration, and a step function generator 11-1 will be only described below in detail.

As shown in FIG. 9, the step function generator 11-1 comprises two tri-state buffers 100, 102 having the inverted output, two tri-state buffers 104, 106 having the non-inverted output, and an adder (ADD) 108 for adding up the data input to the step function generator 11-1 and the data output via any one of the tri-state buffers 100 to 106.

Figure 10:
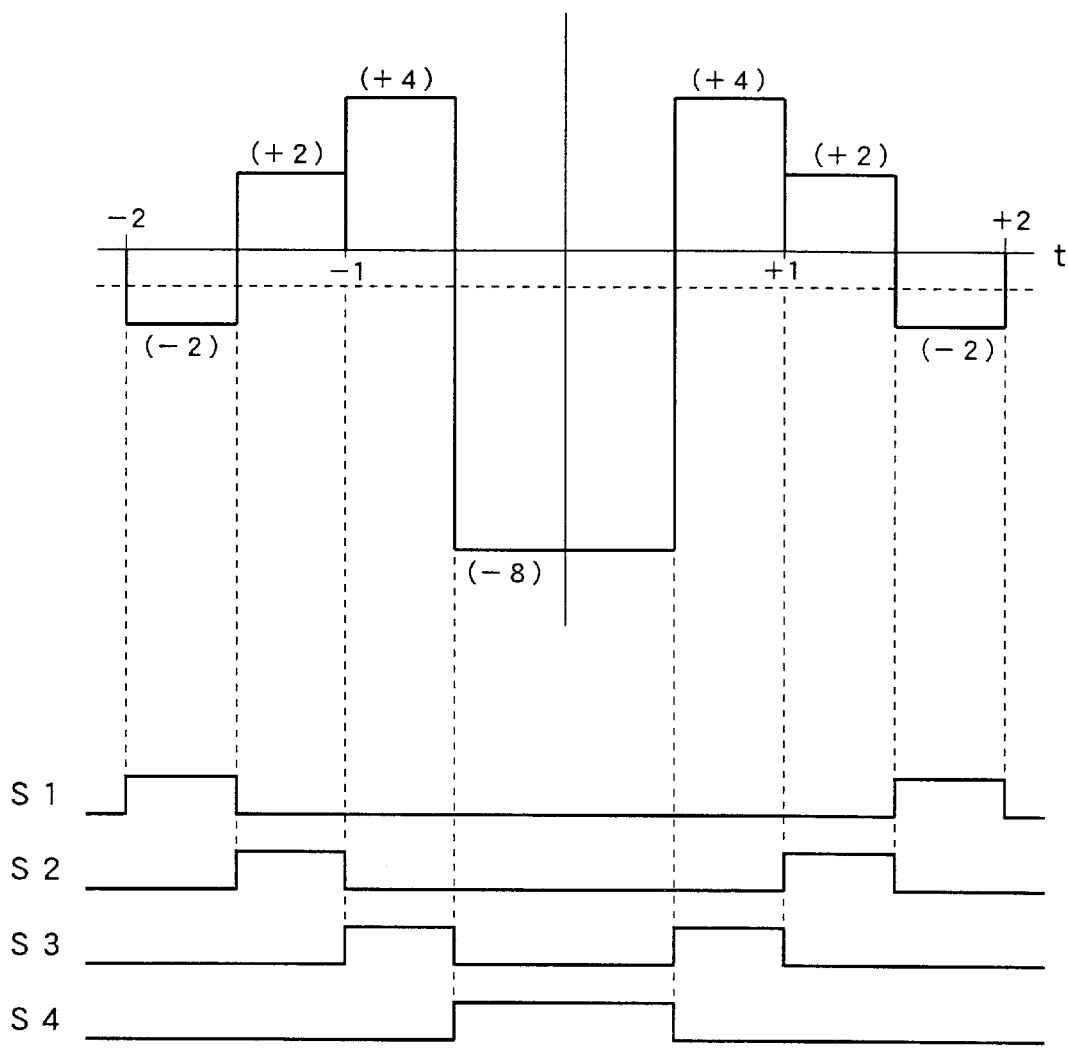
FIG. 10 is a chart showing the relation between a varied step function and the ON/OFF switching timings of each tri-state buffer within the step function generator.

By the way, the step function shown in FIG. 5 is transformed into a step function shown in FIG. 10 by shifting the horizontal axis +1 upwards. This transformed step function takes a value of 2 to the n-th power. Hence, in the case where the input data is multiplied by a multiplier factor of each value, the multiplication can be executed through a simple bit shift operation. Thereafter, the horizontal axis shifted +1 upwards is restored (or the input data is added to the multiplied result) to get an output value of each step function generator.

More specifically, a tri-state buffer 100 performs a multiplication of (−2) times by shifting the input data one bit and inversely outputting each bit of shifted data, as well as adding 1 to a carry input of the adder 108. At a timing indicated at "S1" in FIG. 10, the data corresponding to a multiplied result is output from the tri-state buffer 100, so that the data corresponding to the first and eighth piecewise sections of the step function can be obtained.

Similarly, a tri-state buffer 102 performs a multiplication of two times by shifting the input data one bit. At a timing indicated at "S2" in FIG. 10, the data corresponding to a multiplied result is output from the tri-state buffer 102, so that the data corresponding to the second and seventh piecewise sections of the step function can be obtained.

A tri-state buffer 104 performs a multiplication of four times by shifting the input data two bits. At a timing indicated at "S3" in FIG. 10, the data corresponding to a multiplied result is output from the tri-state buffer 104, so that the data corresponding to the third and sixth piecewise sections of the step function can be obtained.

A tri-state buffer 106 performs a multiplication of (−8) times by shifting the input data three bits, inverting each bit, and adding 1 to a carry input of the adder 108. At a timing indicated at "S4" in FIG. 10, the data corresponding to a multiplied result is output from the tri-state buffer 106, so that the data corresponding to the fourth and fifth piecewise sections of the step function can be obtained.

An adder 108 adds up positive or negative data output selectively from any one of the tri-state buffers 100 to 106, and the data input to the step function generator 11-1. And the resulting data from the adder 108 is output from the step function 11-1.

The adder 108 follows a different processing procedure depending on whether the output data of the tri-state buffers 100, 102 being bit shifted and inverted or the output data of the tri-state buffers 104, 106 being only bit shifted is input. That is, in the case where the addition is performed using the data without bit shift, two data are simply added. On the other hand, in the case where the addition is performed using the data with bit inverted, two data are added, and then the least significant bit b0 is incremented by +1. In order to know to which category the data input to the adder 108 belongs, it is only necessary to investigate whether or not the most significant bit is one.

The adding section 12 shown in FIG. 8 is configured by three adders (ADD) 120, 122, 124 having two input terminals. The data output from four step function generators 11-1 to 11-4 are added by these three adders 120, 122, 124. This result of addition is input to an A/D converter (ADC) 14 to be converted into a stepwise voltage waveform, and applied to the former integrator 16 among two integrators 16, 18 connected in tandem.

As shown in FIG. 8, the former integrator 16 comprises two operational amplifiers 140, 141, two capacitors 142, 143, two resistors 144, 145, and a switch 146. An integration circuit is configured by one operational amplifier 140, a capacitor 142 and a resistor 144, and performs a predetermined integral operation for the output voltage of the A/D converter 14 applied to the non-inverted input terminal of the operational amplifier 140 via the resistor 144. Also, the latter integrator 18 comprises two operational amplifiers 150, 151, two capacitors 152, 153, two resistors 154, 155, and a switch 156. An integration circuit is configured by one operational amplifier 150, a capacitor 152 and a resistor 154, and performs a predetermined integral operation for the output voltage of the former integrator 16 applied to the inverted input terminal of the operational amplifier 150 via the resistor 154.

By the way, the A/D converter of this embodiment is suitable for the uses as a circuit for acquiring the video signal such as an RGB signal or luminance signal of the television receiver, for example. More specifically, the A/D converter of the television receiver comprises three circuits as configured in FIG. 8 corresponding to each of R, G and B data. The 8-bit R, G and B data are input at a predetermined time interval for every scanning line constituting a frame of one screen to produce continuous R, G and B analog voltages that interpolate between the data.

In a practical integration circuit, the output voltage may be drifted. Therefore, it is preferable to have a circuit for removing the influence of drift. In this embodiment, a circuit for keeping the average value at zero level is configured by the operational amplifier 141, the capacitor 143 and the resistor 145 which are contained in the former integrator 16. The voltage level of non-inverted input terminal of the operational amplifier 140 is adjusted so that the average output value of the integration circuit configured by the operation amplifier 140 and so on may be maintained at zero level at any time.

An average level holding circuit is configured by an operational amplifier 152, a capacitor 153 and a resistor 155 which are contained in the latter integrator 18. The voltage level of non-inverted input terminal of the operational amplifier 150 is adjusted so that the average output value of the integration circuit configured by the operation amplifier 150 and so on maybe equal to the voltage level applied to the non-inverted input terminal of the operational amplifier 151. The voltage level applied to the non-inverted input terminal of the operational amplifier 151 can be obtained by converting the input data into an analog voltage, and calculating an average level of the analog voltage. To obtain this voltage level, there are provided a data holding section 180 configured by the D-type flip-flop for holding the input data that is input successively, an A/D converter 182 for producing an analog voltage corresponding to the digital data held, and an integration circuit 184 for integrating an output voltage of the A/D converter 182.

In order to reset electric charges accumulated in an integration capacitor of each integration circuit contained in two integrators 16, 18 for every frame, the switches 146, 156 are provided and turned on during a vertical blanking period while a vertical blanking signal is synchronized by a synchronizing circuit 186 configured by the D-type flip-flop. Then, the capacitor 142 connected to the operational amplifier 140 and the capacitor 152 connected to the operational amplifier 150 are discharged respectively to reset the integration circuit.

Figure 11:
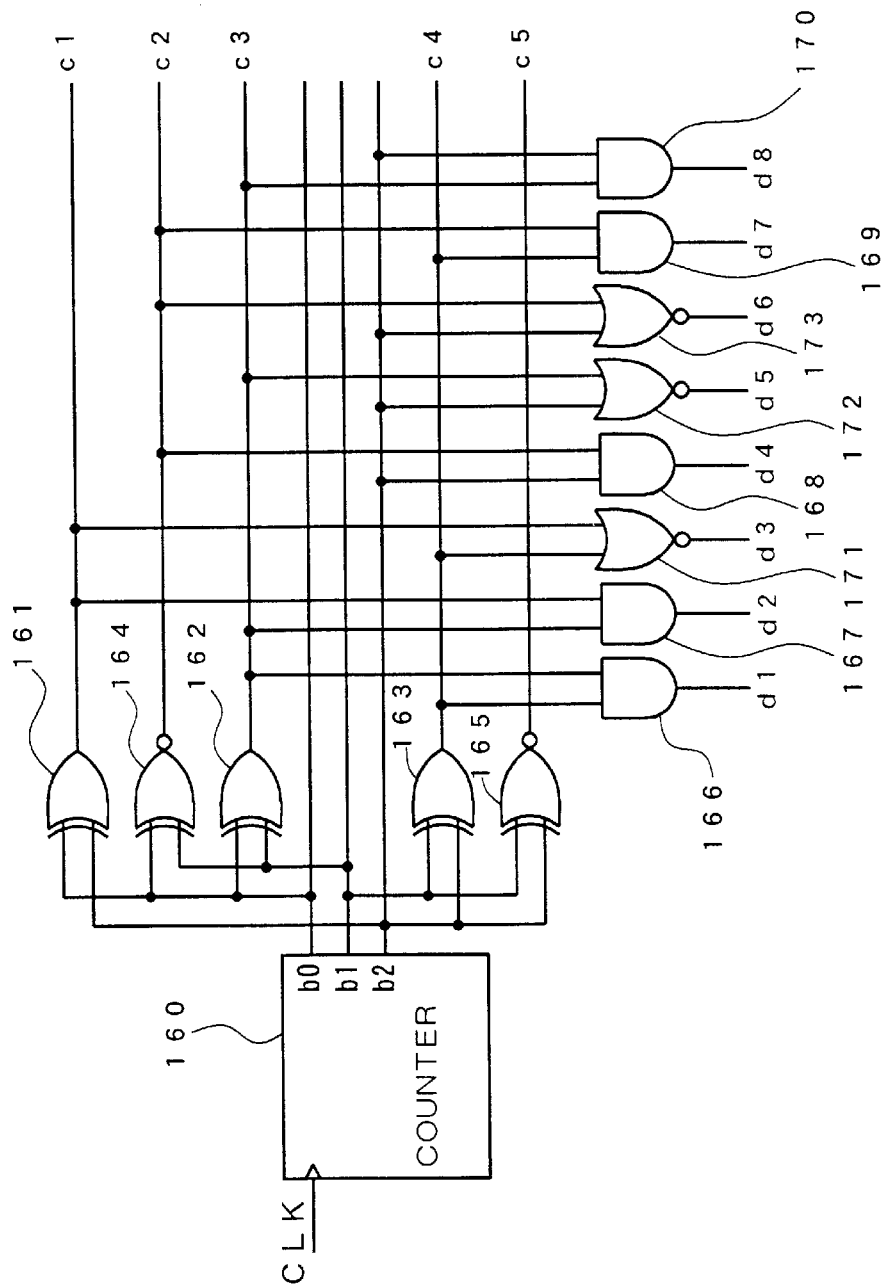
FIG. 11 is a diagram showing a detailed configuration of a timing controller.
Figure 13:
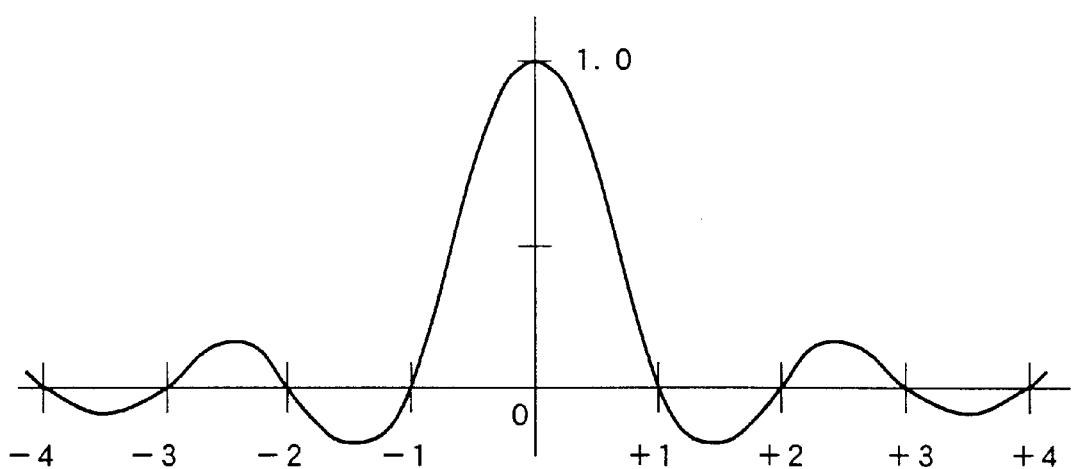
FIG. 13 is an explanatory graph of a sinc function.

FIG. 11 is a diagram showing a detailed configuration of a timing controller 20. As shown in FIG. 11, the timing controller 20 comprises a three-bit counter 160, three exclusive-OR circuits 161 to 163 having the non-inverted output, two exclusive-OR circuits 164, 165 having the inverted output, three AND circuits 166 to 170 having the non-inverted output, and three OR circuits 171 to 173 having the inverted output.

FIG. 12 is a chart showing the operation timings of the timing controller 20 shown in FIG. 11. As shown in FIG. 12, the waveforms of CLK, b0 to b2, c1 to c5, and d1 to d8 appear at positions designated by respective signs in FIG. 11. As shown in FIGS. 11 and 12, the three-bit counter 160 performs a counting operation in synchronization with an input clock signal CLK. The three-bit counter 160 counts up every time this clock signal rises, and the three-bit outputs b0, b1, and b2 are updated.

Three switches contained in each of the step function generators 11-1 to 11-4 are switched on or off, using the above-described timing controller 20, to generate each of the step function shown in FIGS. 7C, 7E, 7G and 7I. More specifically, in order to enable the step function generator 11-1 to generate a step function shown in FIG. 7C, four tri-state buffers 100 to 106 within this step function generator 11-1 are switched on or off depending on the logical states of an output (d3) of an OR circuit 171, an output (d7) of an AND circuit 169, an output (d2) of an and circuit 167, and an output (d1) of an AND circuit 166, as shown in FIG. 11.

Similarly, in order to enable the step function generator 11-2 to generate a step function shown in FIG. 7E, four tri-state buffers 100 to 106 within this step function generator 11-2 are switched on or off depending on the logical states of an output (d6) of an OR circuit 173, an output (d8) of an AND circuit 170, an output (d5) of an OR circuit 172, and an output (d4) of an AND circuit 168, as shown in FIG. 11. Also, in order to enable the step function generator 11-3 to generate a step function as shown in FIG. 7G, four tri-state buffers 100 to 106 within this step function generator 11-3 are switched on or off depending on the logical states of an output (d7) of an AND circuit 169, an output (d3) of an OR circuit 171, an output (d1) of an AND circuit 166, and an output (d2) of an AND circuit 167, as shown in FIG. 11. Also, in order to enable the step function generator 11-4 to generate a step function as shown in FIG. 7I, four tri-state buffers 100 to 106 within this step function generator 11-4 are switched on or off depending on the logical states of an output (d8) of an AND circuit 170, an output (d6) of an OR circuit 173, an output (d4) of an AND circuit 168, and an output (d5) of an OR circuit 172, as shown in FIG. 11.

The present invention is not limited to the above-described embodiments, but may be modified in various ways within the scope or spirit of the invention. For example, in the embodiments described above, the sampling function is a function of a local support differentiable only once over the whole region, but the sampling function may be differentiable twice or more times. Also, the sampling function of this embodiment converges to zero at $t=\pm 2$, as shown in FIG. 1, but may converge to zero at $t=\pm 3$ or beyond. For example, in a case of the sampling function converging to zero at $t=\pm 3$, six data holding sections and six step function generators may be contained in the D/A converter shown in FIG. 6, to generate an analog voltage connecting smoothly six discrete data by performing an interpolation process for the discrete data.

Using a sampling function differentiable finite times having values over the range from $-\infty$ to $+\infty$, rather than a sampling function of a local support, an interpolation process may be performed only for plural digital data corresponding to finite sample point. For example, if such a sampling function is defined by a quadratic piecewise polynomial, the step function waveform can be obtained by differentiating each piecewise polynomial twice. A voltage is combined using this step function waveform, and a resulting voltage is integrated twice to get an analog signal connecting smoothly the voltages corresponding to the digital data.

In the above embodiment, a television receiver is exemplified as one instance of using the D/A converter. However, the D/A converter of the invention may be applied to other uses, such as where digital audio data recorded on the compact disk or the like is converted into an analog audio sound.

INDUSTRIAL APPLICABILITY

As described above, with the present invention, a step function corresponding to each of plural digital data input successively is generated and added, and a result of addition is converted into an analog voltage and integrated to get an analog voltage that changes continuously. Accordingly, there is no need of using a low pass filter to obtain an ultimate analog signal. Therefore, there is no deterioration of the group delay characteristic caused by variable phase characteristics depending on the frequency of a signal to be processed and less distortion can be obtained. Also, since there is no need of speeding up the operation rate of parts, and using expensive parts, unlike the conventional method that performed the oversampling, it is possible to reduce the part costs.

What is claimed is:

1. A digital-to-analog converter comprising a generator and an integrator, wherein said generator generates a predetermined step function corresponding to each of plural digital data input at predetermined intervals and generates a continuous analog signal that connects smoothly between the voltages corresponding to the plural digital data by use of said integrator for analog integrating multiple times a voltage waveform corresponding to the data obtained by adding up these plurality of step functions.

2. A digital-to-analog converter comprising:
   a plurality of data holding sections for holding for predetermined periods of time each of plural digital data to be input at a predetermined interval;
   a plurality of step function generators for generating a predetermined step function corresponding to digital data held in the plurality of data holding sections respectively in synchronization with each timing of inputting the plurality of digital data;
   an adding section for adding a value of the step function generated by each of the step function generators;
   a step voltage waveform generator for generating a step-wise analog voltage corresponding to the digital data obtained by adding process performed by the adding section; and
   an integrator for analog integrating multiple times an analog voltage generated by the step voltage waveform generators.

3. The digital-to-analog converter according to claim 2, wherein said step function has values obtained by differentiating each of piecewise polynomials multiple times, when a sampling function is configured by said piecewise polynomials.

4. The digital-to-analog converter according to claim 3, wherein said sampling function is differentiable only once over the whole region and has values of local support.

5. The digital-to-analog converter according to claim 4, wherein said sampling function is a function of local support having values other than zero in a range where the sample point t is from −2 to +2, and said sampling function is defined such that:

$(-t^2-4t-4)/4$ for $-2 \leq t < -3/2$, $(3t^2+8t+5)/4$ for $-3/2 \leq t < -1$, $(5t^2+12t+7)/4$ for $-1 \leq t < -1/2$, $(-7t^2+4)/4$ for $-1/2 \leq t < 1/2$, $(5t^2-12t+7)/4$ for $1/2 \leq t < 1$, $(3t^2-8t+5)/4$ for $1 \leq t < 3/2$, and $(-t^2+4t-4)/4$ for $3/2 \leq t \leq 2$.

6. The digital-to-analog converter according to claim 5, wherein two analog integral operations are performed, and a continuous analog signal that connects smoothly the voltages corresponding to the plural of digital data is generated.

7. The digital-to-analog converter according to claim 4, wherein two analog integral operations are performed, and a continuous analog signal that connects smoothly the voltages corresponding to the plural of digital data is generated.

8. The digital-to-analog converter according to claim 2, wherein said step function comprises a positive region and a negative region set to have an equal area.

9. The digital-to-analog converter according to claim 2, wherein said step function consists of eight piecewise sections in equal width with a weight of −1, +3, +5, −7, −7, +5, +3, and −1 in a predetermined range corresponding to said five digital data arranged at an equal interval.

10. The digital-to-analog converter according to claim 2, wherein said step function implements the weighting by making the multiplication of −2, +2, +4, −8, −8, +4, +2 and −2 by the bit shift and adding said digital data itself to a result of multiplication.

* * * * *